US008151152B2

(12) United States Patent
Kanari

(10) Patent No.: US 8,151,152 B2

(45) Date of Patent: Apr. 3, 2012

(54) LATCH CIRCUIT INCLUDING DATA INPUT TERMINAL AND SCAN DATA INPUT TERMINAL, AND SEMICONDUCTOR DEVICE AND CONTROL METHOD

(75) Inventor: Katsunao Kanari, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 353 days.

(21) Appl. No.: 12/607,627

(22) Filed: Oct. 28, 2009

(65) Prior Publication Data

US 2010/0122133 A1 May 13, 2010

(30) Foreign Application Priority Data

Nov. 7, 2008 (JP) ................................ 2008-287186

(51) Int. Cl.
*G01R 31/28* (2006.01)

(52) U.S. Cl. .......... 714/726; 714/731; 714/30; 714/718; 714/727; 714/733; 714/734; 711/104; 327/202; 327/208; 327/199; 327/216; 327/218

(58) Field of Classification Search ........................ None
See application file for complete search history.

(56) References Cited

U.S. PATENT DOCUMENTS

| | | | | |
|---|---|---|---|---|
| 4,855,669 | A * | 8/1989 | Mahoney | 324/73.1 |
| 5,619,511 | A * | 4/1997 | Sugisawa et al. | 714/726 |
| 5,668,490 | A * | 9/1997 | Mitra et al. | 327/203 |
| 5,784,384 | A | 7/1998 | Maeno | |
| 6,272,654 | B1 | 8/2001 | Freiburger | |
| 7,411,413 | B2 | 8/2008 | Shimazaki et al. | |
| 2002/0078410 | A1* | 6/2002 | Matsushima | 714/726 |
| 2003/0066001 | A1* | 4/2003 | Sera et al. | 714/726 |
| 2003/0066002 | A1* | 4/2003 | Kanba | 714/726 |
| 2004/0128635 | A1* | 7/2004 | Sahara et al. | 716/6 |
| 2006/0273837 | A1 | 12/2006 | Shimazaki et al. | |
| 2007/0022344 | A1* | 1/2007 | Branch et al. | 714/731 |
| 2007/0162802 | A1* | 7/2007 | Miwa | 714/726 |

FOREIGN PATENT DOCUMENTS

| | | |
|---|---|---|
| GB | 2292855 | 3/1996 |
| JP | 9-270677 | 10/1997 |
| JP | 2005-221352 | 8/2005 |
| JP | 2006-339948 | 12/2006 |

OTHER PUBLICATIONS

Extended European Search Report issued Jan. 25, 2010 in European Patent Application No. 09 17 4697.4.
European Office Action issued Mar. 11, 2011 in European Patent Application No. 09 17 4697.4.

* cited by examiner

*Primary Examiner* — John Trimmings
(74) *Attorney, Agent, or Firm* — Staas & Halsey LLP

(57) ABSTRACT

A latch circuit includes a first latch that stores data provided from a data input terminal when a clock is provided from a clock input terminal, and stores scan data provided from a scan data input terminal when a first scan clock is provided from a first scan clock input terminal, a logical circuit that performs a logical operation for a second scan clock provided from the second scan clock input terminal and for an operational mode signal provided from the operation mode input terminal, and generates an update clock and a second latch including an update input terminal connected to an output terminal of the first latch, and an update clock input terminal connected to an output terminal of the logical circuit, the second latch holds the data or the scan data provided from the update input terminal when the update clock is provided.

9 Claims, 8 Drawing Sheets

SCAN_MODE
SCANCLK_B
CLK
DATA_IN
SCAN_IN
SCANCLK_A
101
11
12
13
14
15
16
17
18
19
20
21
22
23
24
102
111
112
LATCH SECTION
LATCH SECTION
MASTER2
MASTER1

ICLK
31
DATA_IN
35
41
42
43
44
VDD
74
45
75
46
47
81
MASTER1
54
55
PCM1
48
49
50
51
52
53
56
57
PAM1
SCANCLK_A
32
SCAN_IN
33
SCAN_MODE
201
SCANCLK_B
34
211
212
213
214
60
61
62
63
64
65
PCS1
66
67
68
69
70
71
72
73
82
MASTER2

VDD
CLK
SCAN_MODE
SACN_IN
DATA_IN
CK
SM
ACK
BCK
SI
DIN
M1
M2
601
602
603
COMBINATIONAL CIRCUIT
611
612

ICLK
31
DATA_IN
35
SCANCLK_A
32
SCAN_IN
33
SCANCLK_B
34
MASTER1
81
MASTER2
82
PCM1
PAM1
PCS1
VDD
41
42
43
44
45
46
47
48
49
50
51
52
53
54
55
56
57
58
59
60
61
62
63
64
65
66
67
68
69
70
71
72
73
74
75

LATCH CIRCUIT INCLUDING DATA INPUT TERMINAL AND SCAN DATA INPUT TERMINAL, AND SEMICONDUCTOR DEVICE AND CONTROL METHOD

CROSS-REFERENCE TO RELATED APPLICATIONS

This application is based upon and claims priority to prior Japanese Patent Application No. 2008-287186 filed on Nov. 7, 2008 in the Japan Patent Office, the entire contents of which are incorporated herein by reference.

BACKGROUND

1. Field

Embodiments discussed herein relate to a latch circuit including a data input terminal and a scan data input terminal, and a semiconductor device and a control method.

2. Description of the Related Art

For a D-latch (Data latch) circuit to be provided with a scanning function for a test or initial setting use, a first latch is sometimes provided with a second latch that is not used for the normal operation. In this case, the second latch is driven by a scan clock, which is different from a system clock in charge of system operation.

FIG. 7 depicts an exemplary circuit configuration of a previous D-latch circuit having a scanning function. This D-latch circuit is configured to include scan clock input terminals 11 and 15, a clock input terminal 12, a data input terminal 13, a scan data input terminal 14, switches 16, 17, and 19, latch sections 18 and 20, buffers 21 and 22, and data output terminals 23 and 24. Among these components, the switches 16 and 17, and the latch section 18 configure a first latch, and the switch 19 and the latch section 20 configure a second latch.

The scan clock input terminals 15 and 11 are respectively provided with a first scan clock signal SCANCLK_A and a second scan clock signal SCANCLK_B. The clock input terminal 12 is provided with a clock signal CLK, and the data input terminal 13 is provided with a data signal DATA_IN. The scan data input terminal 14 is provided with a scan data signal SCAN_IN.

The switch 16 is turned ON when the clock signal CLK is in a high level (H), and is turned OFF when the clock signal CLK is in a low level (L). The switch 17 is turned ON when the scan clock signal SCANCLK_A is in H, and is turned OFF when the scan clock signal SCANCLK_A is in L. The latch section 18 holds the value of an input signal, and forwards the value to both the switch 19 and the buffer 22. As such, when either the clock signal CLK or the scan clock signal SCANCLK_A is in H, an input signal to the switch 16 or 17 is transmitted to an output terminal of the latch section 18, and when either the clock signal CLK or the scan clock signal SCANCLK_A is in L, an output signal of the latch section 18 is kept.

The switch 19 is turned ON when the scan clock signal SCANCLK_B is in H, and is turned OFF when the scan clock signal SCANCLK_B is in L. The latch section 20 holds the value of an input signal, and outputs the value to the buffer 21. As such, when the scan clock signal SCANCLK_B is in H, an input signal to the switch 19 is transmitted to an output terminal of the latch section 20, and when the scan clock signal SCANCLK_B is in L, an output signal of the latch section 20 is kept.

The buffers 21 and 22 respectively forward the input signals to the data output terminals 23 and 24 after delaying the signals by a predetermined length of time.

For using such a D-latch circuit, there are the following two ways, for example.

1. First Use

During the normal operation, a scan clock signal SCANCLK_A is set to L, and the first latch is driven by a clock signal CLK. A scan clock signal SCANCLK_B is then set to H so that the second latch is set to be in the through state, and the output data from the first latch is forwarded to the data output terminal 23 as it is. In this case, the data output terminal 23 provides a master data signal MASTER2, which is used as slow-speed master data in a circuit in the subsequent stage. Similarly, the data output terminal 24 provides a master data signal MASTER1, which is used as fast-speed master data in the circuit in the subsequent stage.

On the other hand, during the scanning operation, a clock signal CLK is set to L, and the first latch is driven by a scan clock signal SCANCLK_A. The second latch is driven by a scan clock signal SCANCLK_B. In this case, the data output terminal 23 provides a scan data signal as a scan out data signal.

2. Second Use

During the normal operation, a scan clock signal SCANCLK_A is set to L, and the first latch is driven by a clock signal CLK. A scan clock signal SCANCLK_B is then set to L, thereby closing the second latch. In this case, the data output terminal 24 forwards only the master data signal MASTER1 to the circuit in the subsequent stage.

On the other hand, during the scan operation, a clock signal CLK is set to L, and the first latch is driven by a scan clock signal SCANCLK_A. The second latch is driven by a scan clock signal SCANCLK_B. In this case, the data output terminal 23 forwards a scan data signal as a scan out data signal.

FIG. 8 depicts an exemplary detailed configuration of the D-latch circuit of FIG. 7. This D-latch circuit is configured to include a clock input terminal 31, a scan clock input terminals 32 and 34, a data input terminal 35, a scan data input terminal 33, and data output terminals 81 and 82.

The D-latch circuit is also provided with P-channel Metal Oxide Semiconductor Field Effect Transistors (MOSFETs) 41, 43, 46, 48, 50, 51, 54, 56, 58, 60, 62, 63, 66, 68, 70, and 72. The D-latch circuit is also provided with N-channel MOSFETs 42, 44, 47, 49, 52, 53, 55, 57, 59, 61, 64, 65, 67, 69, 71, and 73. The D-latch circuit is also provided with a transfer gate 45.

In the below, the P-channel MOSFETs and the N-channel MOSFETs are respectively denoted as PMOSs and NMOSs. The source electrodes of the PMOSs 41, 43, 46, 48, 50, 54, 56, 58, 60, 62, 66, 68, 70, and 72 are each connected to a power supply potential VDD, and the source electrodes of the NMOSs 42, 44, 47, 49, 53, 55, 57, 59, 61, 65, 67, 69, 71, and 73 are each connected to a ground potential.

The clock input terminal 31 is provided with an inverted clock signal ICLK being a result of inverting the clock signal CLK, and the scan clock input terminals 32 and 34 are respectively provided with the scan clock signals SCANCLK_A and SCANCLK_B. The data input terminal 35 and the scan data input terminal 33 are respectively provided with a data signal DATA_IN and a scan data signal SCAN_IN. From a data output terminal 81, the master data signal MASTER1 is provided, and from a data output terminal 82, the master data signal MASTER2 or the scan out data signal is provided.

The PMOS 41 and the NMOS 42 configure an inverter, which inverts the inverted clock signal ICLK for output to an NMOS-side gate electrode 75 of the transfer gate 45. The inverted clock signal ICLK is provided to a PMOS-side gate electrode 74 of the transfer gate 45. The PMOS 43 and the NMOS 44 also configure an inverter, which inverts the data signal DATA_IN for output to the input terminal of the transfer gate 45.

The transfer gate 45 forwards an input data signal from the output terminal as a data signal PCM1 when the PMOS-side gate electrode 74 and the NMOS-side gate electrode 75 are respectively put in L and H.

The PMOS 46 and the NMOS 47 configure an inverter, which inverts the data signal PCM1, and outputs the master data signal MASTER1.

The PMOSs 48, 50, and 51, and the NMOSs 49, 52, and 53 configure a clocked inverter, which inverts a scan data signal SCAN_IN when the scan clock signal SCANCLK_A is in H, thereby outputting a data signal PCM1.

The PMOS 54 and the NMOS 55 configure an inverter, which inverts the data signal PCM1, thereby outputting a data signal PAM1. The PMOS 56 and the NMOS 57 configure an inverter, which inverts the data signal PAM1, thereby outputting a data signal PCM1. The PMOSs 54 and 56, and the NMOSs 55 and 57 correspond to the latch section 18 of FIG. 7.

The PMOS 58 and the NMOS 59 configure an inverter, which inverts the scan clock signal SCANCLK_B for output. The PMOSs 60, 62, and 63, and the NMOSs 61, 64, and 65 configure a clocked inverter, and when the signal being a result of inverting the scan clock signal SCANCLK_B is in L, i.e., when the scan clock signal SCANCLK_B is in H, inverts the data signal PAM1, thereby outputting a data signal PCS1.

The PMOS 66 and the NMOS 67 configure an inverter, which inverts the data signal PCS1 for output. The PMOS 68 and the NMOS 69 configure an inverter, which inverts the data signal provided by the PMOS 66 and the NMOS 67, thereby outputting the data signal PCS1. The PMOSs 66 and 68, and the NMOSs 67 and 69 correspond to the latch section 20 of FIG. 7.

The PMOS 70 and the NMOS 71 configure an inverter, which inverts the data signal provided by the PMOS 66 and the NMOS 67 for output. The PMOS 72 and the NMOS 73 configure an inverter, which inverts a data signal provided by the PMOS 70 and the NMOS 71, thereby outputting a master data signal MASTER2 or scan out data signal.

The transfer gate 45 corresponds to the switch 16 of FIG. 7, and the clocked inverter including the PMOSs 48, 50, 51, and the NMOSs 49, 52, and 53 correspond to the switch 17 of FIG. 7. Similarly, the clocked inverter including the PMOSs 60, 62, and 63, and the NMOSs 61, 64, and 65 correspond to the switch 19 of FIG. 7.

A pulse latch circuit is also known, which includes the first and second latches, and stops the supply of a clock signal to the second latch when no scan test is performed. A flip-flop circuit is also known, in which a slave latch is provided with a transmission gate, and a mode signal makes the transmission gate non-conductive. A D-flip-flop (Data flip-flop) circuit is also known, which cuts off a signal supply from any periphery circuit by closing a transfer gate of a master section during the normal operation.

[Patent Document 1] Japanese Laid-Open Patent Publication No. 2006-339948

[Patent Document 2] Japanese Laid-Open Patent Publication No. 09-270677

[Patent Document 3] Japanese Laid-Open Patent Publication No. 2005-221352

SUMMARY

According to an aspect of the invention, a latch circuit includes a first latch that stores data provided from a data input terminal when a clock is provided from a clock input terminal, and stores scan data provided from a scan data input terminal when a first scan clock is provided from a first scan clock input terminal, a logical circuit that performs a logical operation for a second scan clock provided from the second scan clock input terminal and for an operational mode signal provided from the operation mode input terminal, and generates an update clock and a second latch including an update input terminal connected to an output terminal of the first latch, and an update clock input terminal connected to an output terminal of the logical circuit, the second latch holds the data or the scan data provided from the update input terminal when the update clock is provided.

The above-described embodiments of the present invention are intended as examples, and all embodiments of the present invention are not limited to including the features described above.

DETAILED DESCRIPTION OF THE PREFERRED EMBODIMENTS

Figure 1:
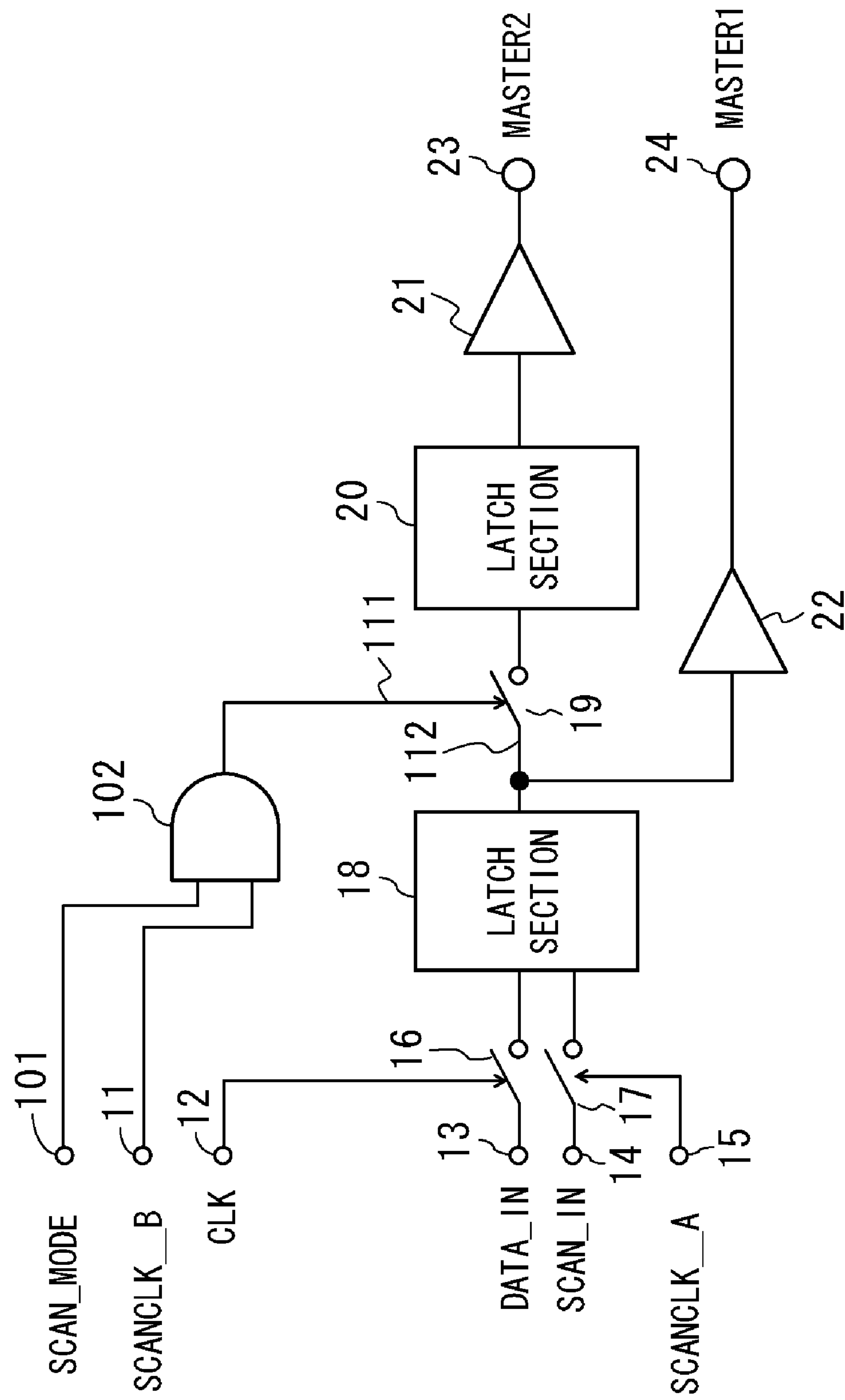
FIG. 1 is a circuit diagram of a first D-latch circuit of an embodiment.

Reference may now be made in detail to embodiments of the present invention, examples of which are illustrated in the accompanying drawings, wherein like reference numerals refer to like elements throughout.

In the below, by referring to the accompanying drawings, an embodiment is described in detail.

A latch circuit can be changed to serve as a high-speed/high-drive latch circuit or as a power-saving latch circuit through change of a connection with an operational mode signal for control use. This accordingly leads to power saving only establishing a connection with an operational mode signal when there is any delay margin at the final design stage.

Figure 7:
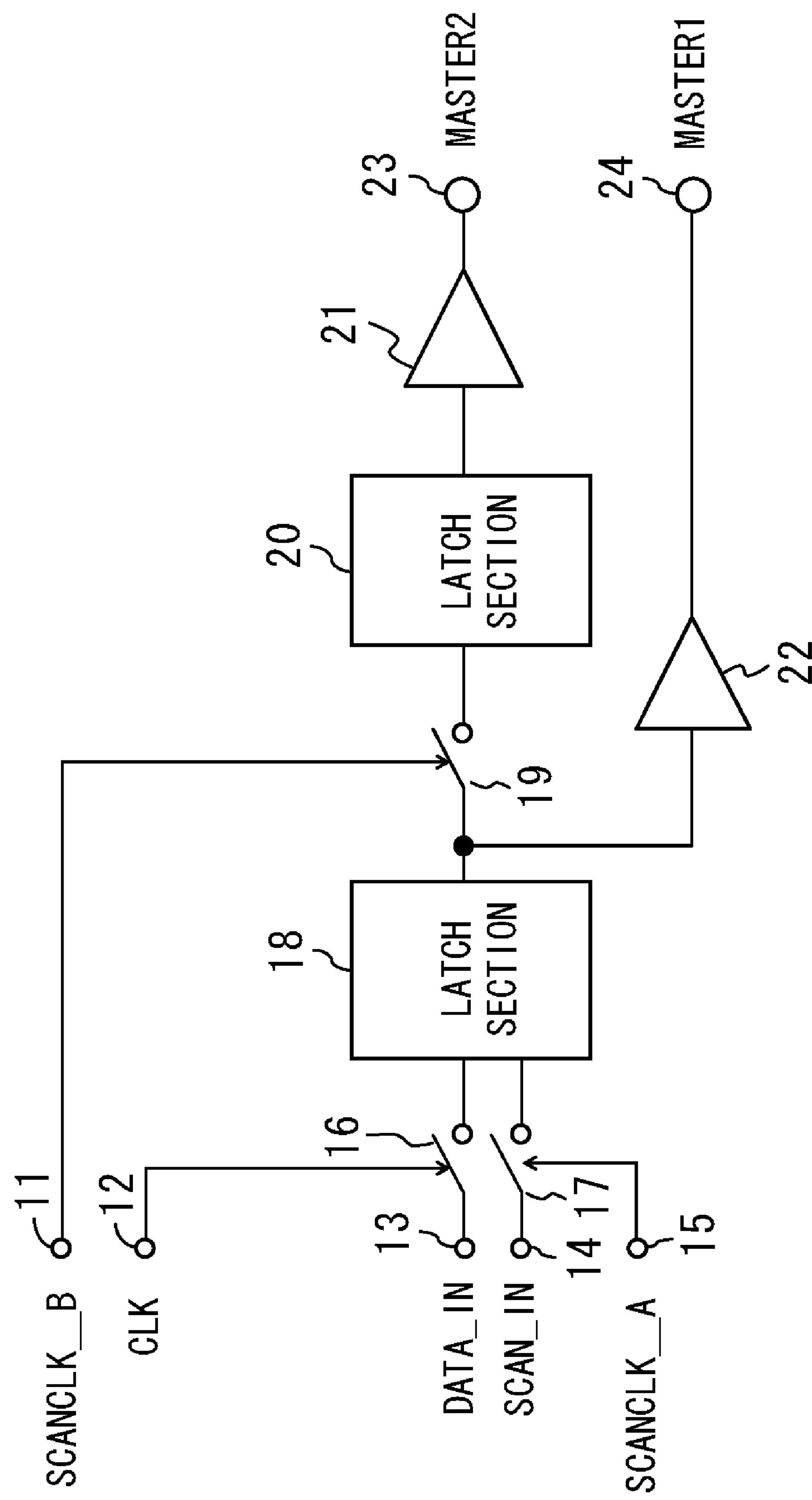
FIG. 7 is a circuit diagram of a previous first D-latch circuit.

FIG. 1 depicts an exemplary configuration of a D-latch circuit provided with a scanning function of the embodiment. Compared with the D-latch circuit of FIG. 7, this D-latch circuit is additionally provided with an operation mode input terminal 101, and an AND circuit 102 as a predetermined logical circuit. The resulting D-latch circuit is provided in a semiconductor device such as IC (Integrated Circuit) chip, for example.

The output terminal of the AND circuit 102 is connected to an update clock input terminal 111 of the switch 19, and the output terminal of the latch section 18 is connected to an update input terminal 112 of the switch 19.

The operation mode input terminal 101 is provided with an operational mode signal SCAN_MODE. The AND circuit 102 computes a logical AND between the operational mode signal SCAN_MODE and a scan clock signal SCANCLK_B, and generates an update clock signal for output to the update clock input terminal 111.

The switch 19 is turned ON when the update clock signal is in H, and is turned OFF when the update clock signal is in L. Accordingly, the switch 19 is turned ON when the operational mode signal SCAN_MODE and the scan clock signal SCANCLK_B are both in H, and is turned OFF when either the operational mode signal SCAN_MODE or the scan clock signal SCANCLK_B is in L. The remaining components, i.e., the switches 16 and 17, the latch sections 18 and 20, and the buffers 21 and 22, all operate similarly to those in the D-latch circuit of FIG. 7.

Such a D-latch circuit operates in the following three operation modes, for example.

1. First Normal Operation Mode

A scan clock signal SCANCLK_A is set to L, and a first latch is driven by a clock signal CLK. Moreover, an operational mode signal SCAN_MODE is set to H, and a scan clock signal SCANCLK_B is set to H, thereby setting a second latch to be in the through state. In this case, the data output terminals 23 and 24 respectively output master data signals MASTER2 and MASTER1.

2. Second Normal Operation Mode

A scan clock signal SCANCLK_A is set to L, and a first latch is driven by a clock signal CLK. Moreover, at least either an operational mode signal SCAN_MODE or a scan clock signal SCANCLK_B is set to be in L, thereby closing a second latch. In this case, the data output terminal 24 outputs only a master data signal MASTER1.

3. Scan Operation Mode

A clock signal CLK is set to L, and the first latch is driven by a scan clock signal SCANCLK_A. Moreover, an operational mode signal SCAN_MODE is set to be in H, thereby driving the second latch by a scan clock signal SCANCLK_B. The signal value H of the scan clock signal SCANCLK_A is input alternately with the signal value H of the scan clock signal SCANCLK_B. In this case, the data output terminal 23 outputs a scan data signal as a scan out data signal.

As such, in the first normal operation mode, the slow-speed master data can be output to a circuit in the subsequent stage, and in the second normal operation mode, the second latch is not driven so that the dynamic power consumption can be reduced.

As an example, at the initial design stage, without connecting the operational mode signal SCAN_MODE to the operation mode input terminal 101, the operation mode input terminal 101 is fixed at the power supply potential to make the slow-speed master data available for use. When the slow-speed master data is not required any more at the late design stage, the operational mode signal SCAN_MODE is connected to the operation mode input terminal 101. This accordingly enables to easily reduce the dynamic power consumption with no need to change the bulk of the IC chip or any other wiring patterns at the final design stage.

Figure 2:
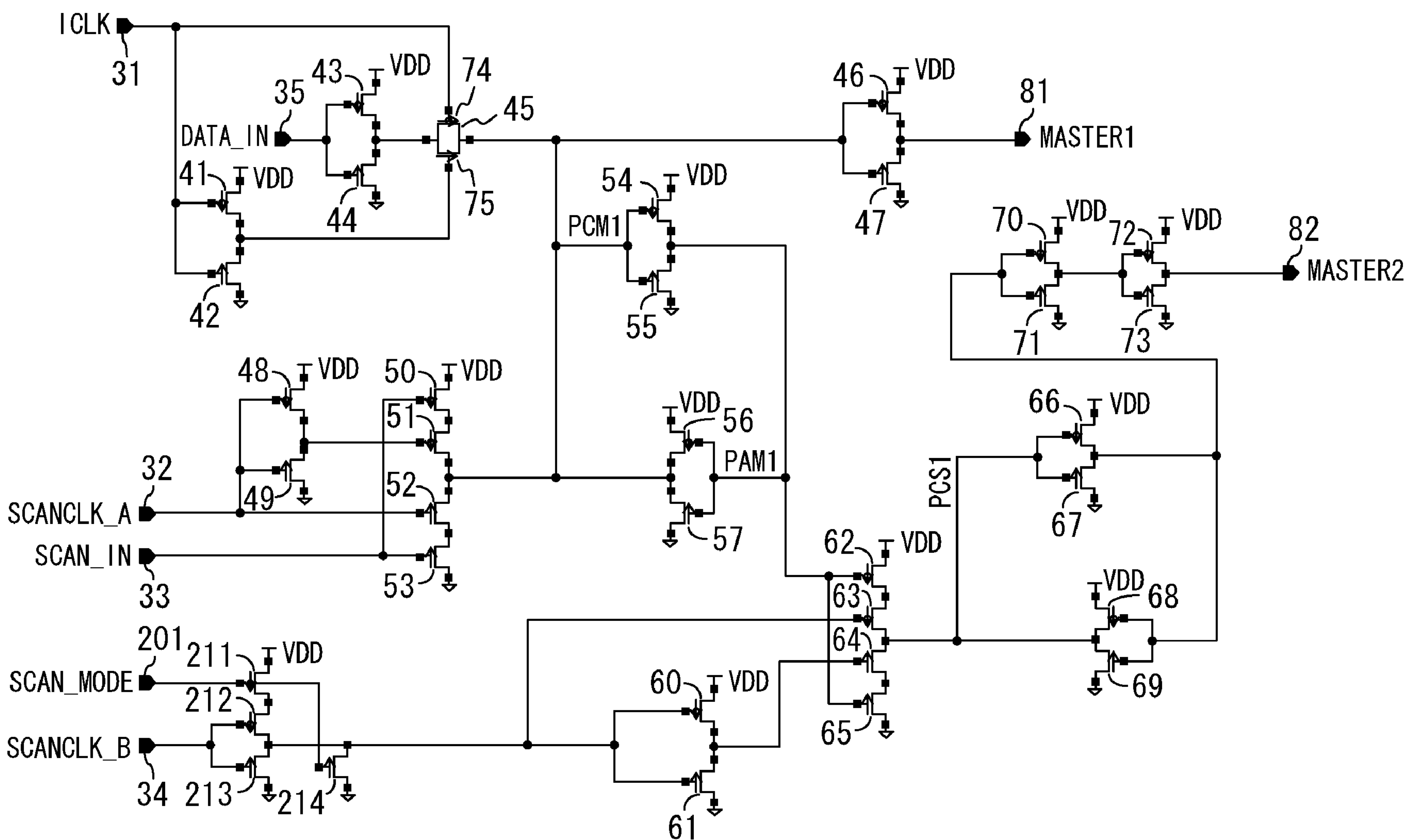
FIG. 2 is a circuit diagram of a second D-latch circuit of the embodiment.
Figure 8:
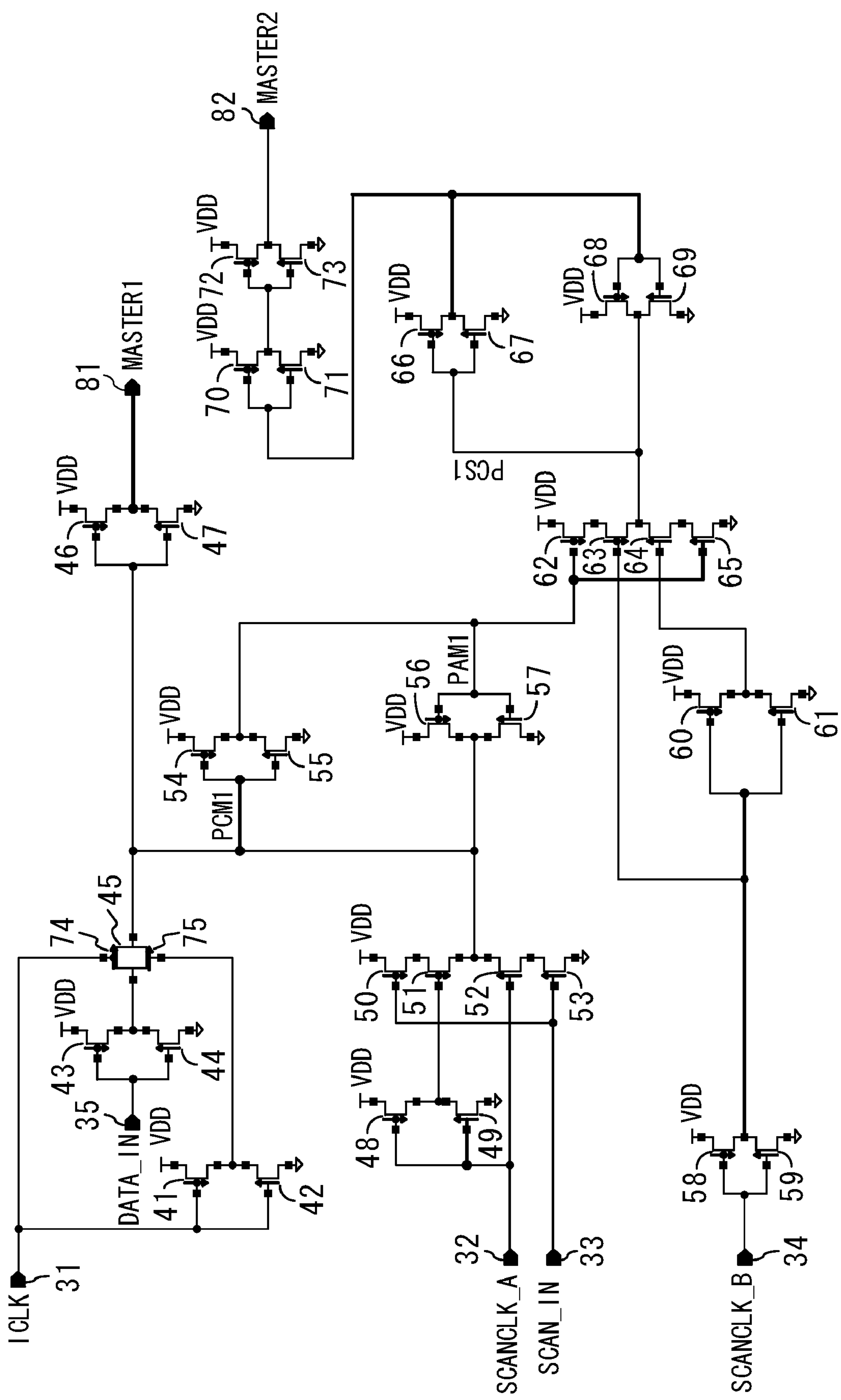
FIG. 8 is a circuit diagram of a previous second D-latch circuit.

FIG. 2 shows an exemplary detailed configuration of a D-latch circuit using an NOR circuit as an alternative to the AND circuit for use as a predetermined logical circuit. Compared with the D-latch circuit of FIG. 8, this D-latch circuit is not provided with the PMOS 58 and the NMOS 59, but is additionally provided with an operation mode input terminal 210, PMOSs 211 and 212, and NMOSs 213 and 214. As such, there are advantages of including only two more transistors compared with the D-latch circuit of FIG. 8.

The source electrode of the PMOS 211 is connected to the power supply potential VDD, and the source electrodes of the NMOSs 213 and 214 are connected to the ground potential.

The operation mode input terminal 201 is provided with the operational mode signal SCAN_MODE. The PMOSs 211 and 212, and the NMOSs 213 and 214 configure an NOR circuit, which computes and outputs a logical NOR between the operational mode signal SCAN_MODE and the scan clock signal SCANCLK_B. This NOR circuit is used as an alternative to the AND circuit 102 of FIG. 1.

When the logical NOR is in L, the clocked inverter including the PMOSs 60, 62, and 63, and the NMOSs 61, 64, and 65 inverts the data signal PAM1, and outputs a data signal PCS1. The remaining circuit components operate similarly to those in FIG. 8.

The D-latch circuit of FIG. 2 operates as follows in each of the operation modes.

1. First Normal Operation Mode

Figure 3:
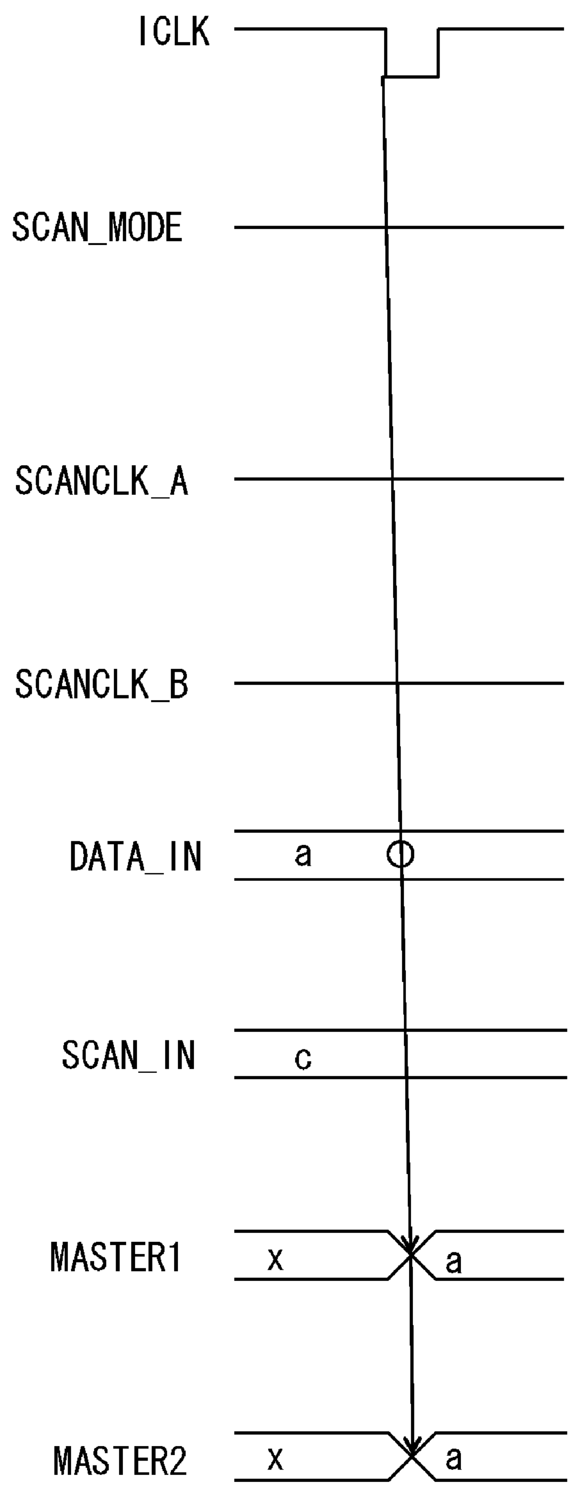
FIG. 3 is a timing chart of a first normal operation mode.

As shown in FIG. 3, a scan clock signal SCANCLK_A is set to L, thereby turning OFF a clocked inverter including the PMOSs 48, 50, and 51, and the NMOSs 49, 52, and 53. The transfer gate 45 is then driven by an inverted clock signal ICLK.

An operational mode signal SCAN_MODE is set to H, and a scan clock signal SCANCLK_B is set to L, thereby turning ON the clocked inverter including the PMOSs 60, 62, and 63, and the NMOSs 61, 64, and 65.

As a result, at the down edge of the inverted clock signal ICLK, a value a of a data signal DATA_IN is stored in the first latch as a data signal PAM1, and is output as a master data signal MASTER1. The data signal PAM1 is stored also in the second latch after passing through the clocked inverter, and is output as a master data signal MASTER2. As such, the master data signals MASTER1 and MASTER2 are changed in value from x to a.

2. Second Normal Operation Mode

Figure 4:
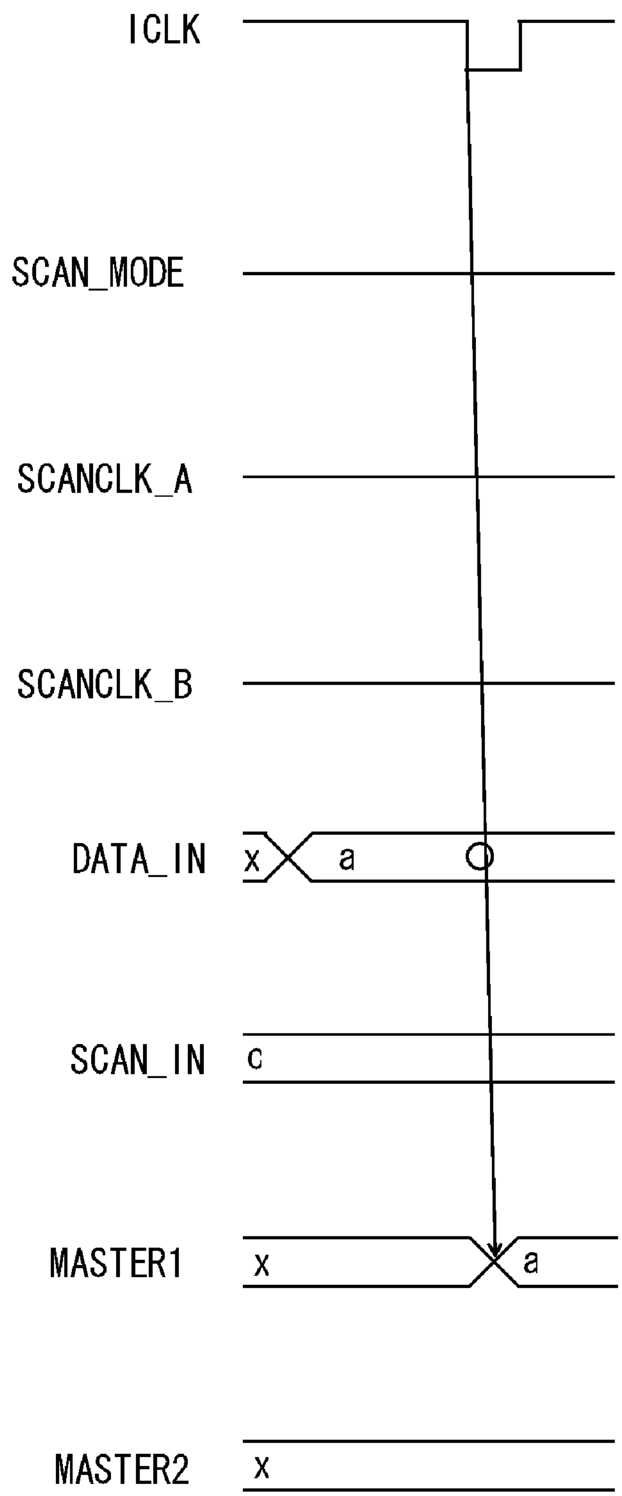
FIG. 4 is a timing chart of a second normal operation mode.

As depicted in FIG. 4, by a scan clock signal SCANCLK_A being set to L, the clocked inverter including the PMOSs 48, 50, and 51, and the NMOSs 49, 52, and 53 is turned OFF. The transfer gate 45 is then driven by an inverted clock signal ICLK.

Moreover, by an operational mode signal SCAN_MODE and the scan clock signal SCANCLK_B both being set to L, the clocked inverter including the PMOSs 60, 62, and 63, and the NMOSs 61, 64, and 65 is turned OFF.

As a result, similarly to the first normal operation mode, at the down edge of the inverted clock signal ICLK, the value a of the data signal DATA_IN is stored in the first latch as a data signal PAM1, and is output as the master data signal MASTER1. However, because the data signal PAM1 does not pass through the clocked inverter, the signal is not stored in the second latch, and thus no change is observed in the value x of a master data signal MASTER2. Accordingly, only the master data signal MASTER1 is changed in value from x to a.

3. Scan Operation Mode

Figure 5:
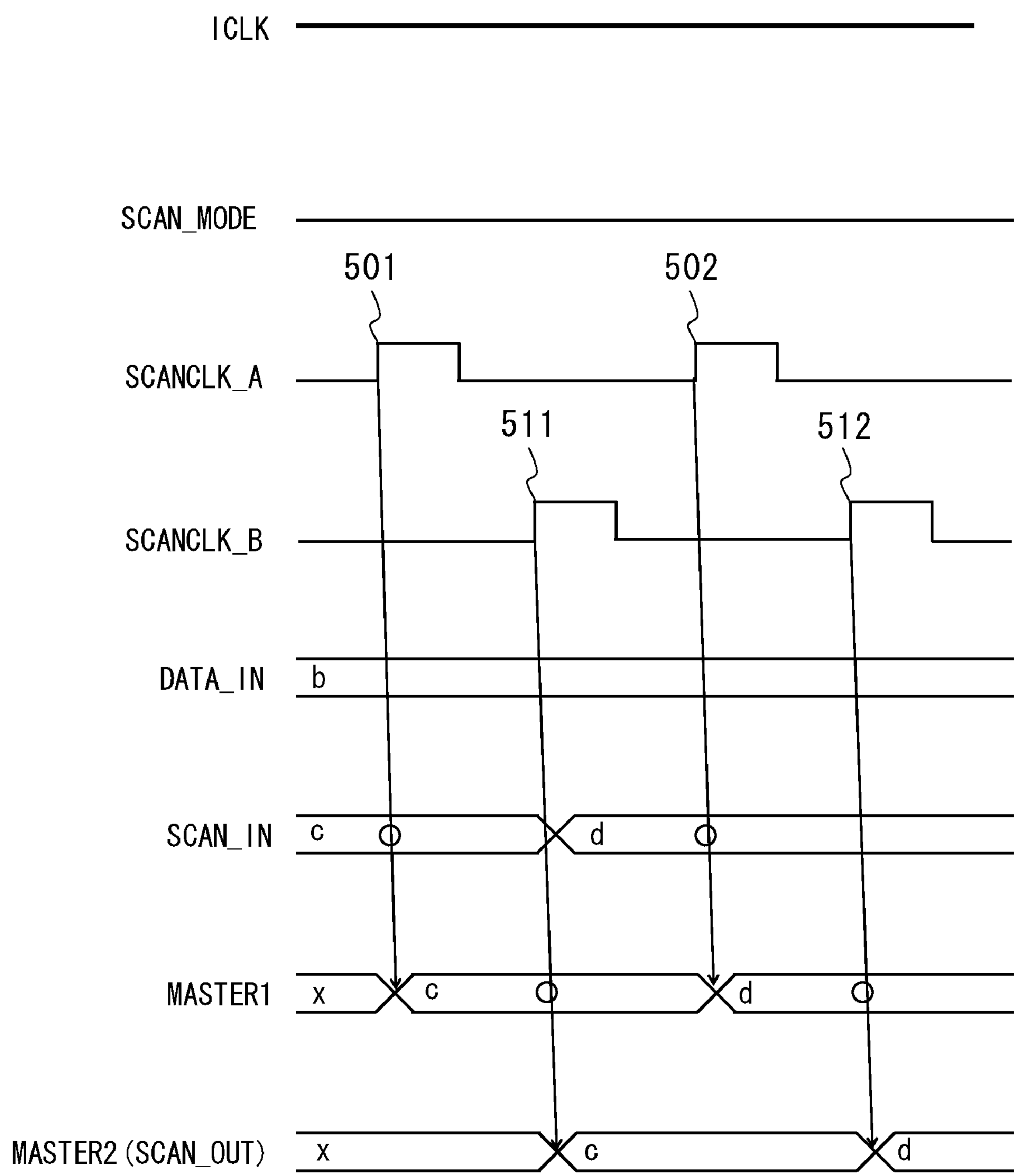
FIG. 5 is a timing chart of a scan operation mode.

As depicted in FIG. 5, by the inverted clock signal ICLK being set to H, the transfer gate 45 is turned OFF. Thereafter, by the scan clock signal SCANCLK_A, the clocked inverter including the PMOSs 48, 50, and 51, and the NMOSs 49, 52, and 53 is driven.

Moreover, by the operational mode signal SCAN_MODE being set to L, the scan clock signal SCANCLK_B drives the clocked inverter including the PMOSs 60, 62, and 63, and the NMOSs 61, 64, and 65. The value H of the scan clock signal SCANCLK_A is input alternately with the signal value H of the scan clock signal SCANCLK_B.

In FIG. 5, the data signal coming from the data output terminal 82 is denoted not as the master data signal MASTER2 but as the scan out data signal SCAN_OUT.

First of all, at an up edge 501 of the scan clock signal SCANCLK_A, a value c of the scan data signal SCAN_IN is stored in the first latch as the data signal PAM1, and is output as the master data signal MASTER1. This changes the value of the master data signal MASTER1 from x to c.

At this time, because the scan clock signal SCANCLK_B is being in L, the clocked inverter including the PMOSs 60, 62, and 63 and the NMOSs 61, 64, and 65 remains OFF, and the data signal PAM1 is thus not stored in the second latch. Accordingly, there is no change of the value x of the scan out data signal SCAN_OUT.

Next, at an up edge 511 of the scan clock signal SCANCLK_B, the clocked inverter including the PMOSs 60, 62, and 63 and the NMOSs 61, 64, and 65 is turned ON so that the value c of the data signal PAM1 is stored in the second latch. This accordingly changes the value of the scan out data signal SCAN_OUT from x to c.

Next, at an up edge 502 of the scan clock signal SCANCLK_A, a value d of the scan data signal SCAN_IN is stored in the first latch as the data signal PAM1, and is output as the master data signal MASTER1. This accordingly changes the value of the master data signal MASTER1 from c to d. At this time, because the scan clock signal SCANCLK_B is being in L, there is no change of the value c of the scan out data signal SCAN_OUT.

Next, at an up edge 512 of the scan clock signal SCANCLK_B, the clocked inverter including the PMOSs 60, 62, and 63 and the NMOSs 61, 64, and 65 is turned ON, and the value d of the data signal PAM1 is stored in the second latch. This accordingly changes the value of the scan out data signal SCAN_OUT from c to d.

Figure 6:
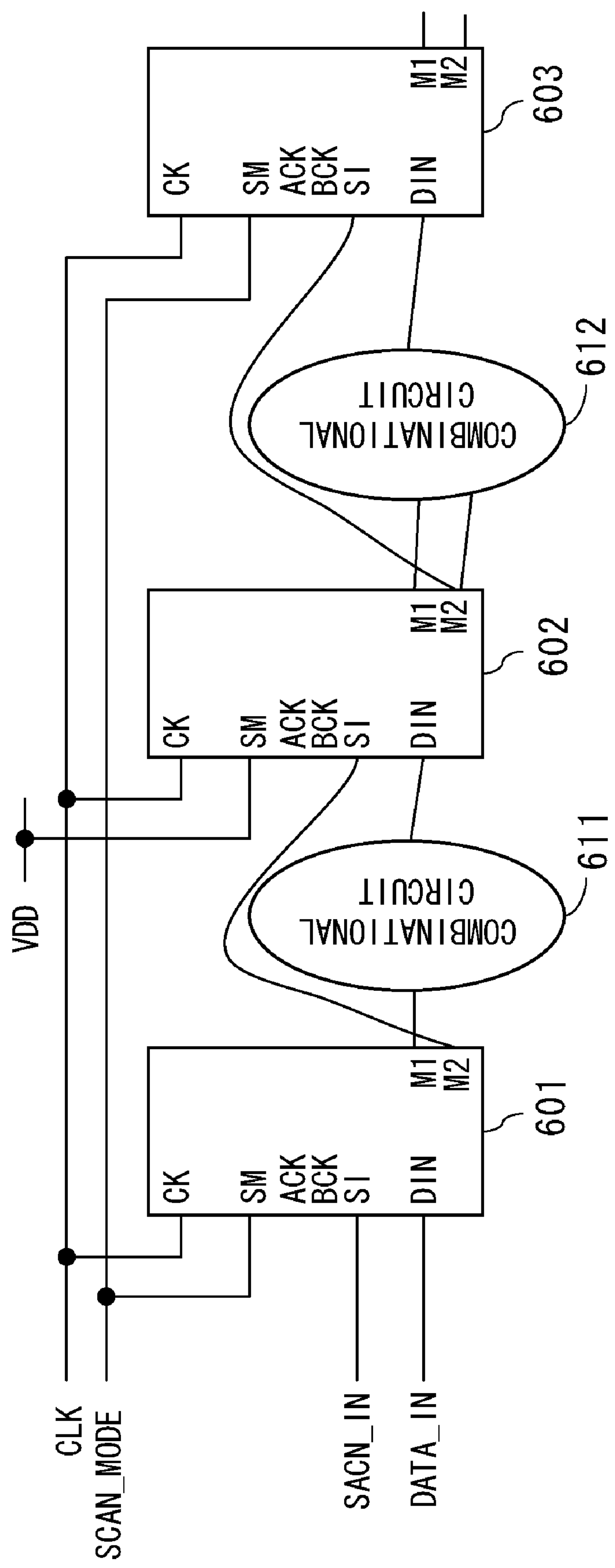
FIG. 6 is a circuit diagram of a circuit including a plurality of D-latch circuits.

FIG. 6 depicts an exemplary circuit including a plurality of the D-latch circuits of FIG. 1. This circuit includes D-latch circuits 601 to 603, and combinational circuits 611 and 612. Such a circuit is provided in a semiconductor device such as IC chip.

The D-latch circuits 601 to 603 each have input terminals CK (ClocK), SM (Scan Mode), ACK (A ClocK), and BCK (B ClocK), which respectively correspond to the input terminals of FIG. 1, i.e., the clock input terminal 12, the operation mode input terminal 101, the scan clock input terminal 15, and the scan clock input terminal 11. The input terminals SI (Scan In) and DIN (Data IN) respectively correspond to the scan data input terminal 14 and the data input terminal 13 of FIG. 1. Output terminals M1 (Master 1) and M2 (Master 2) respectively correspond to the data output terminals 24 and 23 of FIG. 1.

The input terminals CK of the D-latch circuits 601 to 603 are each provided with a clock signal CLK. The input terminals ACK and BCK of the D-latch circuits 601 to 603 are respectively provided with scan clock signals SCANCLK_A and SCANCLK_B. For simplicity of the drawing, signal lines of these scan clock signals are not depicted.

The input terminals SM of the D-latch circuits 601 and 603 are each provided with an operational mode signal SCAN_MODE. The input terminal SM of the D-latch circuit 602 is connected at the power supply potential VDD, and is fixed to be in H.

The input terminals SI and DIN of the D-latch circuit 601 are respectively provided with a scan data signal SCAN_IN and a data signal DATA_IN. The output terminals M1 and M2 of the D-latch circuit 601 are respectively connected to the input terminal of the combinational circuit 611 and the input terminal SI of the D-latch circuit 602. The output terminal of the combinational circuit 611 is connected to the input terminal DIN of the D-latch circuit 602.

The output terminal M1 of the D-latch circuit 602 is connected to the input terminal of the combinational circuit 612, and the output terminal M2 of the D-latch circuit 602 is connected to another input terminal of the combinational circuit 612 and the input terminal SI of the D-latch circuit 603. Moreover, the output terminal of the combinational circuit 612 is connected to the input terminal DIN of the D-latch circuit 603.

With such a configuration, the input terminal SM of each of the D-latch circuits 601 and 603 is provided with the operational mode signal SCAN_MODE so that the D-latch circuits 601 and 603 can operate in the second normal operation mode or in the scan operation mode. When the operational mode signal SCAN_MODE is in L, the D-latch circuits 601 and 603 operate in the second normal operation mode, and operate in the scan operation mode when the operational mode signal SCAN_MODE is in H.

In the scan operation mode, the output terminal M2 of the D-latch circuit 601 is used to output the scan out data signal to the D-latch circuit 602, and the output terminal M2 of the D-latch circuit 603 is used to output the scan out data signal to a circuit in the subsequent stage (not depicted).

On the other hand, because the input terminal SM of the D-latch circuit 602 is being set to H, the D-latch circuit 602 can operate in the first normal operation mode or in the scan operation mode. When the scan clock signal SCANCLK_B is in H, the D-latch circuit 602 operates in the first normal operation mode, and operates in the scan operation mode when the scan clock signal SCANCLK_B is a pulse signal.

In the first normal operation mode, the output terminal M2 of the D-latch circuit 602 is used to output the master data signal MASTER2 to the combinational circuit 612, and in the scan operation mode, is used to output the scan out data signal to the D-latch circuit 603.

In the circuit of FIG. 6, the D-latch circuit of FIG. 2 can be used as an alternative to the D-latch circuit of FIG. 1. If this is the configuration, the input terminals CK of the D-latch circuits 601 to 603 are each provided with an inverted clock signal ICLK as an alternative to a clock signal CLK. Moreover, the input terminals SM of the D-latch circuits 601 and 603 are each set to L through connection to the ground potential, and the input terminal SM of the D-latch circuit 602 is provided with the operational mode signal SCAN_MODE.

As such, as depicted in FIGS. 4 and 5, the D-latch circuits 601 and 603 can be operated in either the second normal operation mode or in the scan operation mode. On the other hand, as depicted in FIGS. 3 and 5, the D-latch circuit 602 can operate in either the first normal operation mode or in the scan operation mode.

Note here that FIG. 6 depicts three D-latch circuits and two combinational circuits, but the number of the D-latch circuits and the number of the combinational circuits are surely not restrictive thereto, and one or more for each circuit type will do.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A latch circuit, comprising:

a first latch including a data input terminal, a clock input terminal, a scan data input terminal, and a first scan clock input terminal, the first latch storing data provided from the data input terminal when a clock is provided from the clock input terminal, and storing scan data provided from the scan data input terminal when a first scan clock is provided from the first scan clock input terminal;

a logical circuit including a second scan clock input terminal and an operation mode input terminal, the logical circuit performing a logical operation for a second scan clock provided from the second scan clock input terminal and for an operational mode signal provided from the operation mode input terminal, and generating an update clock; and a second latch including an update input terminal connected to an output terminal of the first latch, and an update clock input terminal connected to an output terminal of the logical circuit, the second latch holding the data or the scan data provided from the update input terminal when the update clock is provided from the update clock input terminal.

2. The latch circuit according to claim 1, wherein when the operation mode input terminal is connected to a power supply potential or a ground potential, the latch circuit outputs the data stored in the first latch as first master data, and outputs the data stored in the second latch as second master data.

3. The latch circuit according to claim 1, wherein when a scan mode signal is input to the operation mode input terminal, the latch circuit outputs the data stored in the first latch as master data, and outputs the scan data stored in the second latch as scan out data.

4. The latch circuit according to claim 3, wherein an input of the first scan clock is alternately made with an input of the second scan clock.

5. The latch circuit according to claim 1, further comprising:

a first buffer that outputs the data or the scan data from the first latch; and a second buffer that outputs the data or the scan data from the second latch.

6. The latch circuit according to claim 1, wherein the logical operation is logical AND or logical NOR.

7. A circuit comprising a plurality of latch circuits, wherein the plurality of latch circuits each includes:

a first latch including a data input terminal, a clock input terminal, a scan data input terminal, and a first scan clock input terminal, which stores data provided from the data input terminal for output when a clock is provided from the clock input terminal, and stores the scan data provided from the scan data input terminal for output when a first scan clock is provided from the first scan clock input terminal;

a logical circuit including a second scan clock input terminal, and an operation mode input terminal, which performs a logical operation for a second scan clock provided from the second scan clock input terminal and for an operational mode provided from the operation mode input terminal, and generates an update clock for output; and a second latch including an update input terminal connected to an output terminal of the first latch, and an update clock input terminal connected to an output terminal of the logical circuit, which holds the data or the scan data provided from the update input terminal when the update clock is provided from the update clock input terminal, wherein one latch circuit among the plurality of latch circuits outputs the data stored in the first latch as first master data when the operation mode input terminal is connected to a ground potential, and outputs the data stored in the second latch as second master data when the operation mode input terminal is connected to a power supply potential, and wherein another latch circuit among the plurality of latch circuits outputs the data stored in the first latch as master data and the scan data stored in the second latch as scan out data when a scan mode signal is input to the operation mode input terminal.

8. A semiconductor device, comprising:

a first latch including a data input terminal, a clock input terminal, a scan data input terminal, and a first scan clock input terminal stores data provided from the data input terminal for output when a clock is provided from the clock input terminal, and stores the scan data provided from the scan data input terminal for output when a first scan clock is provided from the first scan clock input terminal;

a logical circuit including a second scan clock input terminal, and an operation mode input terminal performs a logical operation for a second scan clock provided from the second scan clock input terminal and for an operational mode provided from the operation mode input terminal, and generates an update clock for output; and a second latch including an update input terminal connected to an output terminal of the first latch, and an update clock input terminal connected to an output terminal of the logical circuit, holds the data or the scan data provided from the update input terminal when the update clock is provided from the update clock input terminal.

9. A control method of a latch circuit including a first latch having a data input terminal, a clock input terminal, a scan data input terminal, and a first scan clock input terminal, a second latch having an update input terminal connected to an output terminal of the first latch, a second scan clock input terminal, and an operation mode input terminal, the method comprising:

connecting the operation mode input terminal to a power supply potential or a ground potential;

performing a logical operation for the power supply potential or the ground potential input from the second scan clock input terminal and the power supply potential or the ground potential input from the operation mode input terminal, and outputting a result of the logic operation to the second latch;

inputting a clock to the clock input terminal of the first latch;

inputting data to the data input terminal of the first latch;

holding the data input from the data input terminal by the first latch;

outputting the data from the first latch to the second latch;

holding the data input from the update input terminal by the second latch;

inputting a second scan clock to the second scan clock input terminal of the second latch;

inputting a scan mode to the operation mode input terminal of the second latch;

performing a logical operation for the second scan clock input from the second scan clock input terminal and the scan mode input from the operation mode input terminal, generating an update clock, and outputting the update clock to the second latch;

inputting a first scan clock to the first scan clock input terminal of the first latch;

inputting scan data to the scan data input terminal of the first latch;

holding the scan data input from the scan data input terminal by the first latch;

outputting the scan data output from the first latch; and holding the scan data input from the update input terminal by the second latch.

* * * * *